United States Patent
Kawaguchi et al.

(10) Patent No.: US 6,764,871 B2
(45) Date of Patent: Jul. 20, 2004

(54) METHOD FOR FABRICATING A NITRIDE SEMICONDUCTOR DEVICE

(75) Inventors: Yasutoshi Kawaguchi, Kadoma (JP); Akihiko Ishibashi, Osaka (JP); Ayumu Tsujimura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/465,647

(22) Filed: Jun. 20, 2003

(65) Prior Publication Data

US 2003/0232457 A1 Dec. 18, 2003

Related U.S. Application Data

(63) Continuation of application No. PCT/JP03/00451, filed on Jan. 21, 2003.

(30) Foreign Application Priority Data

Jan. 21, 2002 (JP) ......................................... 2002-11335

(51) Int. Cl.$^7$ .............................................. H01L 21/00
(52) U.S. Cl. .......................................... 438/46; 438/47
(58) Field of Search ............................. 438/46, 47, 37, 438/39, 41

(56) References Cited

U.S. PATENT DOCUMENTS

| | | | | |
|---|---|---|---|---|
| 6,015,979 A | * | 1/2000 | Sugiura et al. | 257/86 |
| 6,030,848 A | * | 2/2000 | Yuge et al. | 438/46 |
| 6,232,623 B1 | * | 5/2001 | Morita | 257/103 |
| 6,408,015 B1 | * | 6/2002 | Kaneko | 372/50 |
| 2001/0019136 A1 | * | 9/2001 | Sugawara et al. | 257/103 |

FOREIGN PATENT DOCUMENTS

| | | |
|---|---|---|
| EP | WO 03/063215 A1 * | 7/2003 |
| JP | 5-82447 | 4/1993 |
| JP | 8-8185 | 1/1996 |
| JP | 8-264899 | 10/1996 |
| JP | 9-40490 | 2/1997 |
| JP | 10-32349 | 2/1998 |
| JP | 11-162847 | 6/1999 |
| JP | 2000-82671 | 3/2000 |
| WO | WO 99/25030 | 5/1999 |

OTHER PUBLICATIONS

Tadao Hashimoto et al., 'Reduction of Threading Dislocations in GaN on Sapphirre by Buffer Layer Annealing in Low–Pressure Metalorganic Chemical Vapor Deposition', Japanese Journal of Applied Physics, Part 1, Dec. 1999, vol. 38, No. 12A, pp. 6605 to 6610.

(List continued on next page.)

Primary Examiner—Michael Trinh
(74) Attorney, Agent, or Firm—McDermott, Will & Emery (57) ABSTRACT

A method for fabricating a nitride semiconductor device comprising steps of forming a low-temperature deposited layer composed of a Group III-Group V nitride semiconductor containing at least Al onto a surface of substrate (101) at a first temperature; subjecting the low-temperature deposited layer to heat treatment at a second temperature, which is higher than the first temperature, and converting the low-temperature deposited layer into a faceted layer (102); initially growing a GaN based semiconductor layer (103) onto a surface of the faceted layer at a third temperature; and fully growing the GaN based semiconductor layer at a fourth temperature that is lower than the third temperature. By employing the method for fabricating a nitride semiconductor device according to the present invention, it is possible to provide a nitride semiconductor device with high quality and high reliability.

11 Claims, 6 Drawing Sheets

OTHER PUBLICATIONS

Takahiro Ito et al., 'Influence of Thermal Annealing on GaN Buffer Layers and the Property of Subsequent GaN Layers Grown by Metalorganic Chemical Vapor Deposition', Japanese Journal of Applied Physics, Part 1, Feb. 1999, vol. 38, No. 2A, pp. 649 to 653.

T. Sasaki et al., 'Analysis of Two–Step–Growth Conditions for GaN on an AlN Buffer Layer', Journal of Applied Physics, Jan. 1, 1995, vol. 77, No. 1, pp. 192 to 200.

JP–10–032349 English Abstract, Nakamura et al; Feb. 3, 1998, 1 page.*

* cited by examiner

PRIOR ART

Fig.10

PRIOR ART

Fig.11

METHOD FOR FABRICATING A NITRIDE SEMICONDUCTOR DEVICE

REFERENCE TO RELATED APPLICATION

This Application is a continuation of International Application No. PCT/JP03/00451, whose international filing date is Jan. 21, 2003, which in turn claims the benefit of Japanese Patent Application No. 2002-011335, filed Jan. 21, 2002, the disclosures of which Applications are incorporated by reference herein. The benefit of the filing and priority dates of the International and Japanese Applications is respectfully requested.

TECHNICAL FIELD

The present invention relates to a method for fabricating a nitride semiconductor device. Specifically, the present invention relates to a method for fabricating nitride semiconductor devices, such as semiconductor lasers, light emitting diodes, ultraviolet detectors and like GaN based light receiving/emitting devices, the application of which is anticipated in the field of optical information processing; and field-effect transistors, transistors with high electron mobility, and like GaN based electron devices, the application of which is anticipated in the field of high-frequency and high-output communications.

BACKGROUND ART

Group III-Group V nitride semiconductors that contain nitrogen (N) in the Group V element are excellent candidates as useful materials for short-wavelength light emitting devices because of their wide band gap. Among these, extensive research has been conducted on gallium nitride based compound semiconductors (AlGaInN and like GaN based semiconductors), and blue light emitting diodes (LED), and green LEDs have already been put to practical use. Furthermore, in order to increase the storage capacity of an optical disc apparatus, a semiconductor laser with its oscillation wavelength in the 400-nm band is in strong demand. For this reason, semiconductor lasers using GaN based semiconductors have attracted widespread attention, and are now approaching a level of practical use.

Furthermore, since the nitride semiconductor has a wide band gap as described above, as well as an electric field with high dielectric breakdown and high electron saturation drift velocity, it is believed that development of a GaN based transistor that can be operated under high temperatures and high electric power, and that has a high-speed switching characteristic, is feasible, thus leading to its research. The performance of this GaN based transistor is expected to be superior to the heretofore-used silicon (Si) based and gallium arsenide (GaAs) based transistors.

According to examples of prior art (laser structure: Appl. Phys. Lett., VOL. 69, NO. 26, P4056–4058 (1996), and transistor structure: Appl. Phys. Lett., VOL. 73, NO. 21, P3147–3149 (1998)), the GaN based semiconductor device structure is fabricated onto a sapphire substrate in the following manner using metalorganic vapor phase epitaxy (MOVPE) technique.

First, a GaN low-temperature deposited layer or an AlN low-temperature deposited layer is grown on the substrate on top of which a GaN layer is subjected to crystal growth until the thickness thereof becomes 1 $\mu$m to 10 $\mu$m. This method is called a two-step growth method. Then, using the resulting GaN layer as a template, AlGaInN based heterostructures are formed one by one to obtain the GaN based semiconductor device structure.

Figure 10:
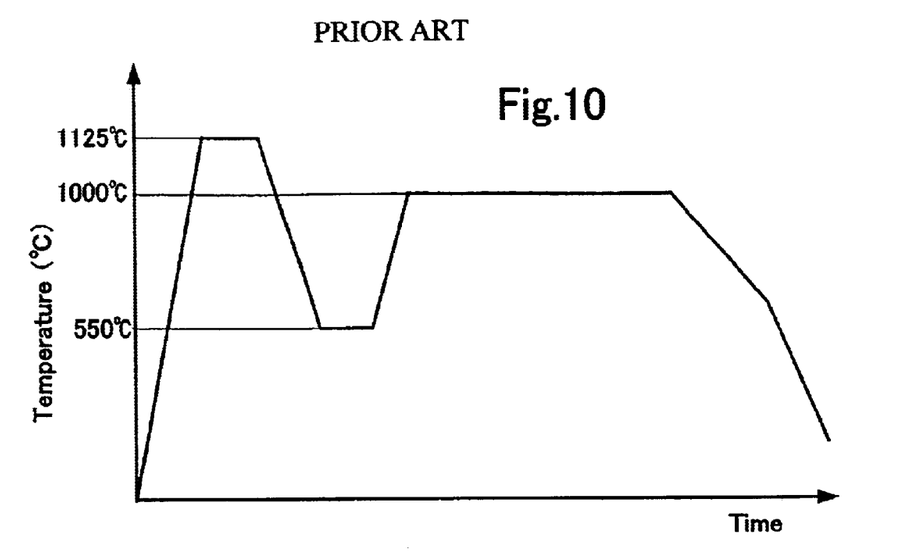
FIG. 10 is a diagram showing the temperature sequence in fabrication of the GaN template by a known method.

Such a film formation method in which a semiconductor crystal is grown on a substrate is disclosed, for example, in Japanese Unexamined Patent Publication No. 1997-40490, Japanese Unexamined Patent Publication No. 1996-8185, Japanese Unexamined Patent Publication No. 1993-82447, etc. According to the method for preparing a GaN crystal disclosed in Japanese Unexamined Patent Publication No. 1997-40490, the temperature program shown in FIG. 10 is followed wherein, first, the surface of the sapphire substrate is treated under a hydrogen atmosphere at 1,125° C. Then, the temperature is lowered to 550° C. and the low-temperature deposited layer of AlN is grown. Thereafter, the temperature is raised to 1,000° C. and, after the GaN layer is grown, the substrate is cooled.

Figure 11:
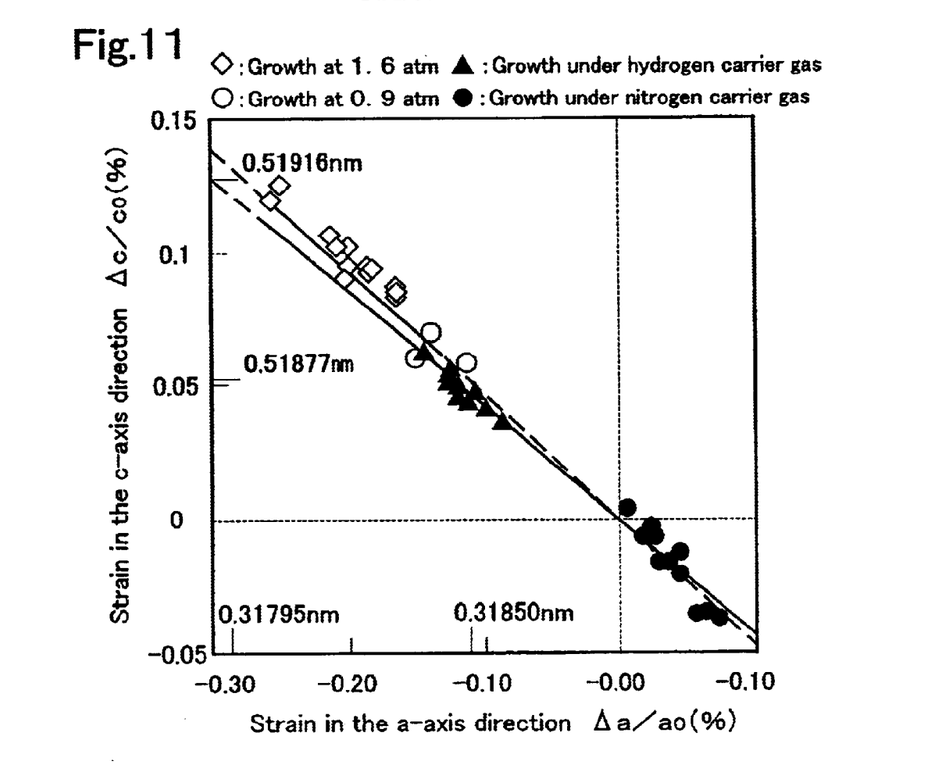
FIG. 11 shows the relationship between the a-axis lattice constant and the c-axis lattice constant of a GaN layer formed on a C-plane sapphire substrate using a known GaN template.

It has long been known that the GaN layer in the GaN template obtained by this two-step growing method is subject to compressive strain or tensile strain due to the differences in growth conditions. As an example, FIG. 11 shows the relationship between the a-axis lattice constant and the c-axis lattice constant in the GaN layer formed on a C-plane sapphire substrate. In FIG. 11, the vertical axis indicates the c-axis direction (the direction perpendicular to the substrate) and the horizontal axis indicates the a-axis direction (the direction parallel to the substrate). This figure indicates the lattice constant of a GaN layer that is subjected to elastic deformation due to lattice strain as it is formed on a sapphire substrate, by converting the lattice constant into an amount of lattice strain and comparing it to the bulk lattice constant of a free-standing GaN crystal.

The GaN layer formed on the sapphire substrate exhibits lattice strain because of differences in the coefficients of thermal expansion between the sapphire substrate and the GaN layer (sapphire: $7.75 \times 10^{-6} K^{-1}$, GaN: $5.59 \times 10^{-6} K^{-1}$) and in their growing mechanisms. This lattice strain varies depending on the difference in the growing conditions of the GaN layer, and either compressive or tensile elastic lattice strain is applied to the C-plane (substrate surface).

By increasing the crystal growth pressure of the GaN layer, for example, from a low-pressure (0.9 atm.) to a raised-pressure (1.6 atm.) atmosphere, it is possible to increase the compressive strain in the C-plane. Furthermore, if hydrogen ($H_2$) is used as the carrier gas during GaN crystal growth, compressive stain occurs in the C-plane, while, on the other hand, if nitrogen ($N_2$) is used, tensile strain occurs in the C-plane (raised-pressure growth: phys. stat. sol., (a) 176, 23 (1999), variation of carrier gas: Appl. Phys. Lett., VOL.75, NO.26, P4106–4108(1999)).

Heretofore, it has been known that the lattice strain applied to the GaN layer varies depending on the growth conditions as described above. However, the method for controlling the lattice strain has not been sufficiently investigated. This has resulted in threading dislocation in the GaN layer at high densities, reducing the fabrication yield. For example, it is known that in GaN layers grown on a sapphire substrate by known two-step growth methods, threading dislocation exists at a density of $1 \times 10^8$ $cm^{-2}$ to $1 \times 10^{10}$ $cm^{-2}$; however, in order to improve device performance, the threading dislocation density should be reduced to about $1 \times 10^5$ $cm^{-2}$. Therefore, the demand is growing for a technique to reduce threading dislocation density.

DISCLOSURE OF THE INVENTION

An object of the present invention is to provide a method for fabricating a nitride semiconductor device with high quality and high reliability.

The above object of the present invention can be achieved by a method for fabricating a nitride semiconductor device comprising the steps of forming a low-temperature deposited layer composed of a Group III-Group V nitride semiconductor that contains at least Al onto a surface of a substrate at a first temperature; subjecting the low-temperature deposited layer to heat treatment at a second temperature, which is higher than the first temperature, and converting the low-temperature deposited layer into a faceted layer; initially growing a GaN based semiconductor layer onto a surface of the faceted layer at a third temperature; and fully growing the GaN based semiconductor layer at a fourth temperature, which is lower than the third temperature.

BEST MODE FOR CARRYING OUT THE INVENTION (Embodiment 1)

Figure 1:
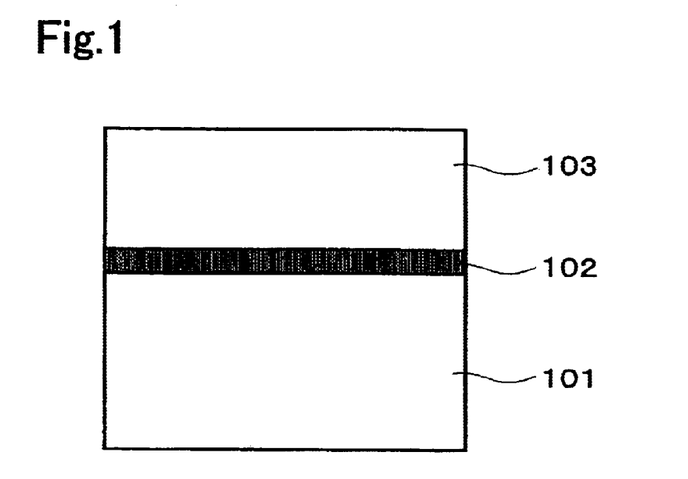
FIG. 1 shows a structural sectional view of a GaN template fabricated by a method according to one embodiment of the present invention.

An embodiment of the present invention will be explained while referring to the drawings. FIG. 1 is a structural sectional view of a GaN template fabricated by a method according to one embodiment of the present invention. In this GaN template, a GaN layer 103, which is one example of a GaN based semiconductor layer, is formed on a C-plane sapphire substrate 101 through a faceted layer 102 that is formed of $Al_{0.1}Ga_{0.9}N$.

Metalorganic vapor phase epitaxy (MOVPE) technique is employed as the crystal growth method on the substrate in the present embodiment; however, hydride vapor phase epitaxy (HVPE), molecular beam epitaxy (MBE), chemical beam epitaxy (CBE), or the like various known epitaxy techniques can be employed. Hereunder, the process for crystal growth will be explained by referring to the temperature sequence diagram shown in FIG. 2.

Figure 2:
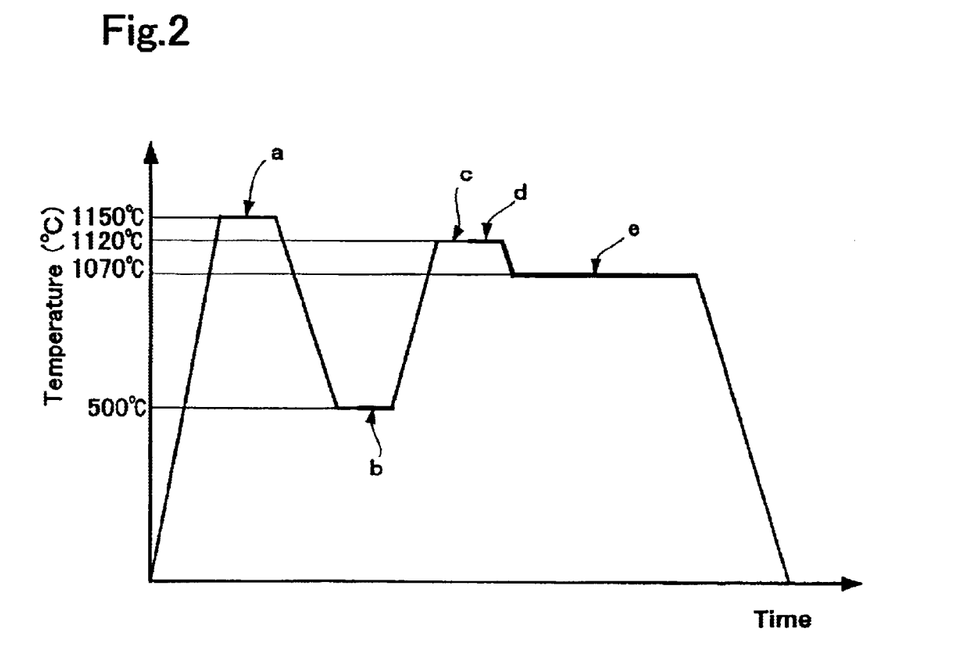
FIG. 2 is a diagram showing the temperature sequence in the fabrication method for the GaN template.

First, the sapphire substrate 101 is heated to 1,150° C. while supplying only a carrier gas of $N_2$ and $H_2$, and surface impurities are removed (arrow a). Then, an $Al_{0.1}Ga_{0.9}N$ low-temperature deposited layer (not shown) is formed by lowering the temperature to 500° C. and supplying trimethyl gallium (TMG), trimethyl aluminum (TMA), and $NH_3$ to the sapphire substrate 101 (first temperature: arrow b). It is preferable that the $Al_{0.1}Ga_{0.9}N$ low-temperature deposited layer be formed at a temperature in the range of 400 to 650° C. and more preferably in the range of 400 to 600° C.

Thereafter, the temperature is raised to 1,120° C., and the $Al_{0.1}Ga_{0.9}N$ low-temperature deposited layer is subjected to heat treatment under the optimum conditions (second temperature: arrow c). The time period of the heat treatment is preferably about 1 to 10 minutes, and more preferably about 2 to 5 minutes. The optimum conditions for the heat treatment are such that the decomposition and removal speed of the low-temperature deposited layer is slow, the rearrangement of the atoms that compose the low-temperature deposited layer smoothly starts, and the layer is converted into a faceted layer 102 with good reproducibility. The details of these optimum conditions will be described later.

Then, TMG and $NH_3$ are supplied while maintaining the temperature at 1,120° C., and the GaN layer 103 is subjected to an initial growth stage (third temperature: arrow d). After the thickness of the GaN layer 103 has become about 50 nm during the initial growth stage, the temperature is continuously lowered to and maintained at 1,070° C. The GaN layer 103 is then subjected to the main growth stage until it reaches a thickness of about 1.5 $\mu$m (fourth temperature: arrow e).

The pressure during crystal growth can be a low-pressure atmosphere, atmospheric pressure, or a pressurized atmosphere. Also, the pressure can be suitably altered for each layer. The carrier gas for supplying the material to the substrate contains at least one inert gas, such as $N_2$, $H_2$, etc.

The lattice constants in the c-axis direction (in the direction perpendicular to the substrate) and the a-axis direction (in the direction along the substrate) of the GaN layer 103 in the thus obtained GaN template were accurately measured using a 4-crystal X-ray diffractometer. The lattice constant of the c-axis was 0.51901 nm and the lattice constant of the a-axis was 0.31816 nm. There were almost no pits in the surface morphology and the crystal was growing in the step flow mode. Here, the pit means a concavity having a diameter of about 100 nm to 1,000 nm that is formed on the surface of the crystal.

The c-axis lattice constant of a free-standing GaN bulk is 0.5185 nm and the a-axis lattice constant thereof is 0.3189 nm. The coefficient of thermal expansion for the sapphire substrate 301 is greater than that of the GaN layer 303 (the coefficients of thermal expansion for GaN and sapphire are $5.59\times10^{-6}$/K and $7.5\times10^{-6}$/K, respectively). Therefore, when the temperature is lowered from the growth temperature, the GaN layer 303 is compressively strained in the C-plane (the surface of the substrate), whereby the c-axis lattice constant is expanded and the a-axis lattice constant is compressed.

The present inventors conducted experiments and found that the lattice constant of the GaN layer in a GaN template that has a sapphire substrate is greatly influenced by the initial growth stage of the GaN and the crystallinity of the GaN layer. For example, by sufficiently raising the temperature of the substrate and starting the initial growth of the GaN after forming a low-temperature deposited layer, the sapphire substrate thermally expands in a sufficient manner. The a-axis of the GaN template is thereby further compressed. It also became clear that the lattice constant of the GaN layer can be controlled by varying the temperature of the heat treatment for the low-temperature deposited layer and the temperature of initial growth stage of the GaN in the range of, for example, 900 to 1,150° C.

Figure 3:
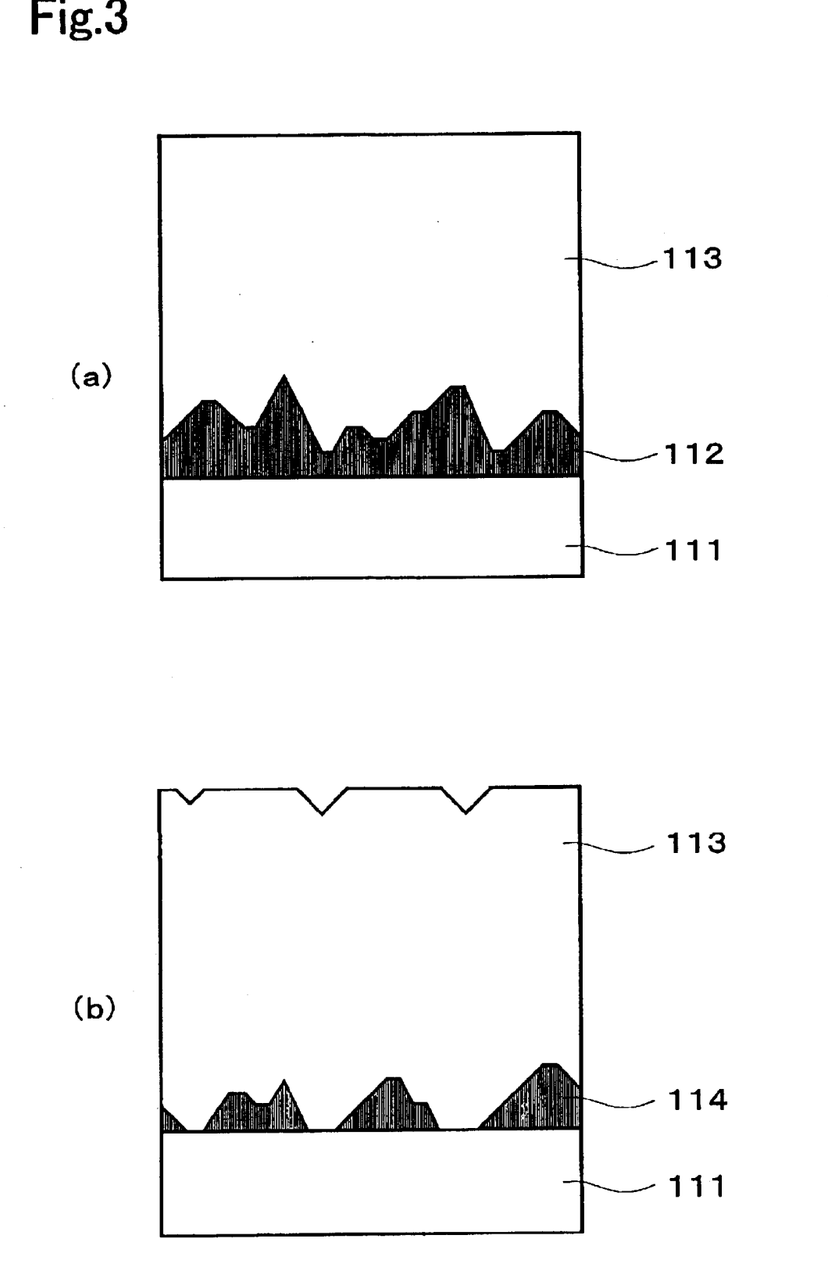
FIG. 3 shows a structural sectional view of a GaN template fabricated by a method according to another embodiment of the present invention.

Such control of the lattice constant of the GaN layer will be explained in further detail. As shown in FIG. 3(a), a low-temperature deposited layer (not shown) that is composed of Al-containing $Al_xGa_yIn_{1-x-y}N$ is deposited on the sapphire substrate 111, and the $Al_xGa_yIn_{1-x-y}N$ low-temperature deposited layer is subjected to heat treatment under a temperature higher than the film-deposition temperature. It is preferable that this heat treatment temperature be higher than the temperature of the main growth stage of the GaN layer, which will be described later. To be more specific, it is preferable that the heat treatment temperature of the $Al_xGa_yIn_{1-x-y}N$ low-temperature deposited layer be no lower than 800° C., and more preferably no lower than 950° C. Thereby, the rearrangement of atoms occurs in the $Al_xGa_yIn_{1-x-y}N$ low-temperature deposited layer 112 and it becomes an $Al_xGa_yIn_{1-x-y}N$ faceted layer 112 wherein a facet plane, which will become the most desirable growing nucleus, is formed on the surface of the substrate.

After forming the faceted layer 112 containing such a facet plane, the a-axis of the GaN layer is further compressed by sufficiently raising the substrate temperature in the initial growth stage of the GaN and starting the growth of the GaN layer under the condition that the sapphire substrate is thermally expanded in a sufficient manner. By suitably selecting the initial growth conditions of the GaN, particularly the temperature of the heat treatment for the low-temperature deposited layer and the temperature of the initial growth stage of the GaN layer, it becomes possible to control the lattice constant of the GaN layer.

Figure 4:
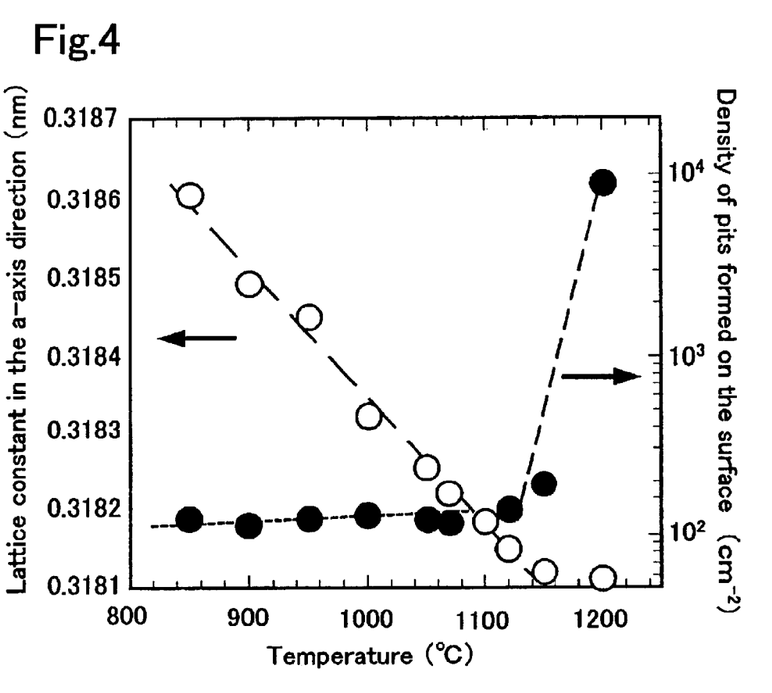
FIG. 4 is a diagram showing the relationships of the lattice constant of the GaN layer in the a-axis direction and the density of pits formed on the surface thereof relative to the initial GaN growth temperature.

FIG. 4 shows the relationships of the lattice constant of the GaN layer in the a-axis direction and the density of pits formed on the surface thereof relative to the initial GaN growth temperature. As described above, after depositing the $Al_{0.1}Ga_{0.9}N$ low-temperature deposited layer at 500° C., the temperature is raised. Then, the conversion of the $Al_{0.1}Ga_{0.9}N$ low-temperature deposited layer into an $Al_{0.1}Ga_{0.9}N$ faceted layer 112 by heat treatment, the initial growth of the GaN layer 113, and the main growth of the GaN layer 113 are conducted, in this order. The temperature of the heat treatment of the low-temperature deposited layer and the temperature of the initial growth stage of the GaN layer 113 are set to be the same. Furthermore, after conducting the initial growth until the thickness of the layer reaches 50 nm, the main growth of the GaN layer 113 is performed by continuously lowering the temperature to 1,070° C., and then maintaining that temperature, thus forming the GaN layer 113 with a thickness of 1.5 μm.

As is clear from FIG. 4, by varying the initial growth temperature of the GaN in the range of 850 to 1,150° C., it is possible to control the lattice constant in the C-plane of the GaN layer 113. Specifically, when the initial growth of the GaN is conducted at 1,120° C., the lattice constant in the a-axis direction becomes 0.31816 nm, which corresponds to the lattice constant in the a-axis direction of a free-standing AlGaN layer that contains 9.3% Al. In other words, the $Al_{0.093}Ga_{0.907}N$ layer aligns the lattice on the GaN template and this is significantly effective for preventing cracks during the formation of an AlGaN/GaN heterostructure. It is preferable that the lattice constant in the a-axis direction of the GaN layer be 0.31795 to 0.31850 nm, and that the lattice constant in the c-axis direction thereof be 0.51877 to 0.51916 nm. Note that the method for controlling the temperature of the main growth of the GaN is somewhat effective for controlling the lattice constant of the GaN layer 113.

When the temperature of the initial growth of the GaN exceeds 1,150° C., the decreasing ratio of the lattice constant in the a-axis direction tends to approach 0 even when the temperature is raised. This is closely related to the density of the pits formed on the surface thereof. In other words, when the heat treatment temperature of the $Al_{0.1}Ga_{0.9}N$ low-temperature deposited layer and the temperature of the initial growth of the GaN layer 113 exceeds 1,150° C., the density of the pits formed on the surface of the GaN layer 113 rapidly increases. This is because the density of the growth nuclei decreases as the $Al_{0.1}Ga_{0.9}N$ low-temperature deposited layer decomposes during heat treatment, and therefore the transition of the growth pattern from three-dimensional to two-dimensional growth does not occur smoothly, resulting in the formation of pits. Therefore, it is preferable that the heat treatment of the low-temperature deposited layer and the initial growth of the GaN layer 113 be conducted at a sufficiently high temperature that intense decomposition of the low-temperature deposited layer does not occur. This makes it possible to control the lattice constant and flatten the surface morphology.

The heat treatment temperature of the low-temperature deposited layer and the initial growth temperature of the GaN layer 113 do not necessarily need to be the same, as they are in the present embodiment, as long as they are higher than the main growth temperature of the GaN layer 113. Therefore, the temperature of the heat treatment of the low-temperature deposited layer can be higher than that of the initial growth of the GaN layer 113, and vice versa.

Furthermore, in the present embodiment, the growth temperature is continuously changed from the initial growth temperature to the main growth temperature of the GaN layer 113; however, the temperature can also be changed stepwise. The same is true for changing the temperature of the heat treatment of the low-temperature deposited layer to the temperature of the initial growth of the GaN layer 113. It is preferable that the temperature difference when shifting from the initial growth to the main growth be 10 to 50° C., preferably 20 to 45° C., and more preferably 30 to 40° C.

The above explanation can be applied to the case where the $Al_xGa_yIn_{1-x-y}N$ low-temperature deposited layer contains Al. When a low-temperature deposited layer without Al (for example, a GaInN low-temperature deposited layer is formed), if the initial growth of the GaN is conducted under the above-described conditions, intense decomposition of the low-temperature deposited layer occurs and a desirable facet plane cannot be formed. This results in a defective faceted layer 114, as shown in FIG. 3(b), leading to a phenomenon in which the density of the growth nuclei decreases. In other words, when the GaN layer 113 is grown on a GaInN low-temperature deposited layer, the lattice constant can be controlled. However, in this case, the surface morphology has a large number of irregularities and only a GaN layer 113 with a high density of pits ($5.5 \times 10^3$ $cm^{-2}$ to $1.5 \times 10^4$ $cm^{-2}$) can be obtained.

In order to obtain a GaN layer 113 with an excellent morphology that has almost no pits and that grows in a step flow growth mode, the heat treatment temperature and the initial growth temperature should be low (for example, 850 to 950° C.). This limits the controllable range of the lattice constant of the GaN layer 113, thus making it an ineffective means. In an actual example, the c-axis lattice constant was from 0.51865 nm to 0.51881 nm and the a-axis lattice constant was from 0.31866 nm to 0.31844 nm. Therefore, the controllable range was narrower than the case where an Al-contained $Al_xGa_yIn_{1-x-y}N$ low-temperature deposited layer is used. When a laser device is fabricated using this GaN template, the lattice mismatch between the $Al_{0.09}Ga_{0.91}N$ cladding layer and the GaN layer is unduly large, and this causes cracks and decreases the yield.

On the other hand, when a GaN template is formed using an Al-contained $Al_xGa_yIn_{1-x-y}N$ low-temperature deposited layer, it is possible to control the lattice constant of the GaN layer. This enables the lattice constant thereof to substantially match that of the $Al_{0.09}Ga_{0.91}N$ cladding layer and prevents cracks, thus enabling the fabrication of a laser structure with a high yield.

As described above, it is possible to fabricate a high-quality, high-reliability nitride semiconductor device by using an $Al_xGa_yIn_{1-x-y}N$ low-temperature deposited layer that contains at least Al, and by employing the most desirable temperature range for conducting heat treatment of the low-temperature deposited layer and converting it into a faceted layer, and also for conducting the initial growth of the GaN layer.

Figure 5:
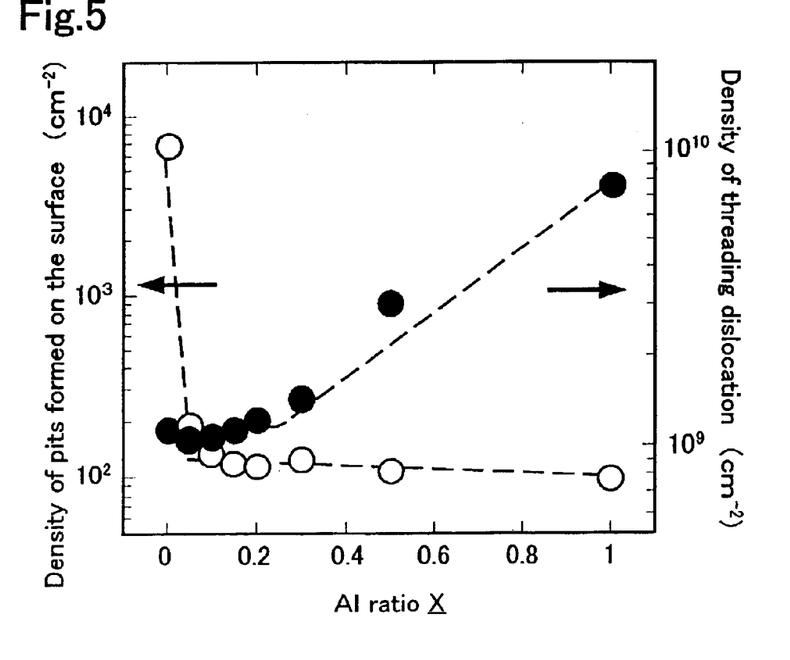
FIG. 5 is a diagram showing the relationships of the density of pits formed on the surface of the GaN template and the threading dislocation near density the surface thereof relative to the Al component ratio in the AlGaInN low-temperature deposited layer.

Next, a desirable composition ratio of Al in the $Al_xGa_yIn_{1-x-y}N$ low-temperature deposited layer will be explained. FIG. 5 shows the surface pit density of the GaN template and the threading dislocation near the surface, relative to the Al composition x in the $Al_xGa_yIn_{1-x-y}N$ low-temperature deposited layer. The film thickness and heat treatment temperature of the low-temperature deposited layer, the initial growth temperature of the GaN layer, and other conditions comply with the temperature sequence shown in FIG. 2.

When x=0, i.e., the GaN template was fabricated using a $Ga_yIn_{1-y}N$ low-temperature deposited layer that contained no Al, as described above, intense decomposition of the low-temperature deposited layer occurred due to the heat treatment, resulting in a defective faceted layer. This decreased the density of the growth nuclei, and caused the surface pit density of the GaN template to increase by more than a digit compared to the case where an Al contained $Al_xGa_yIn_{1-x-y}N$ low-temperature deposited layer was used. Therefore, it is important that the low-temperature deposited layer contains at least Al to control the number of pits.

The dependence of the pit density on the Al composition in the low-temperature deposited layer was small at less than $1 \times 10^2$ cm$^{-2}$, which is almost below than the measurable limit. On the other hand, the threading dislocation density of the GaN template relative to the Al composition of the low-temperature deposited layer was such that, when the Al composition x was 0.3 or less, the density thereof was at or below $2 \times 10^9$ cm$^{-2}$, which is the standard level for obtaining satisfactory yield. When x exceeded 0.3, the density thereof became greater than $2 \times 10^9$ cm$^{-2}$. When x=1, i.e., when an AlN low-temperature deposited layer was used, the density was about $1 \times 10^{10}$ cm$^{-2}$. It is assumed that this is because, by increasing the Al composition in the low-temperature deposited layer, the density of the growth nuclei increased and the lattice constant of the growth nucleus became smaller. This increased the distribution of the shift (twist) of the crystal axis in the growth plane, thus preventing sufficient elimination of threading dislocations during the initial stage of growth. As is clear from this result, it is preferable that the composition of Al in the $Al_xGa_yIn_{1-x-y}N$ low-temperature deposited layer be greater than 0% and no higher than 30%.

As described above, it is possible to obtain a GaN template that has little threading dislocation and a suppressed level of surface pits, by using an $Al_xGa_yIn_{1-x-y}N$ ($0<x\leq0.3$, $0<y<1$, $0<x+y\leq1$) low-temperature deposited layer and conducting heat treatment of the low-temperature deposited layer, converting it into a faceted layer at a temperature that is lower than the decomposition and desorption temperature and higher than the main growth temperature of the GaN layer, and conducting the initial growth of the GaN layer at a temperature that is suitable for the lattice constant to be controlled. It is preferable that the range of x be $0.02\leq x\leq0.20$, and more preferably $0.05\leq x\leq0.15$.

The present embodiment describes a method for fabricating a GaN template in which a GaN layer is formed on a substrate using a low-temperature deposited layer. However, the GaN layer can contain Al, B, In, or like substances, and the template can be composed of $Al_wGa_{1-w}N$ ($0<w\leq0.3$), another nitride semiconductor mixed crystal or like GaN based semiconductor layers and still achieve the same effects of the present embodiment by fabricating it under the conditions described above. In a GaN based semiconductor layer that is composed of $Al_wGa_{1-w}N$ ($0<w\leq0.3$), it is preferable that the c-axis lattice constant be in the range of $0.51877–0.020308 \times w$ (nm) to $0.51916–0.020323 \times w$ (nm) and the range of the a-axis lattice constant be from $0.31850–0.007665 \times w$ (nm) to $0.31795–0.007652 \times w$ (nm).

Furthermore, the composition of the constituent elements in the low-temperature deposited layer immediately after growth, and the composition of the constituent elements after the layer has been converted into a faceted layer by heat treatment, can be the same or different.

While a C-plane sapphire substrate is used in the present embodiment, it is also possible to use an A-plane sapphire substrate, or a substrate that is slightly inclined relative to the C-plane toward the A-plane, M-plane, etc. Other than the sapphire substrate, it is also possible to use a substrate composed of gallium arsenide, spinel, magnesium oxide, gallium nitride, aluminum gallium nitride, etc. It is preferable that the material have a coefficient of thermal expansion greater than that of the GaN based semiconductor layer that serves as a template.

(Embodiment 2)

Figure 6:
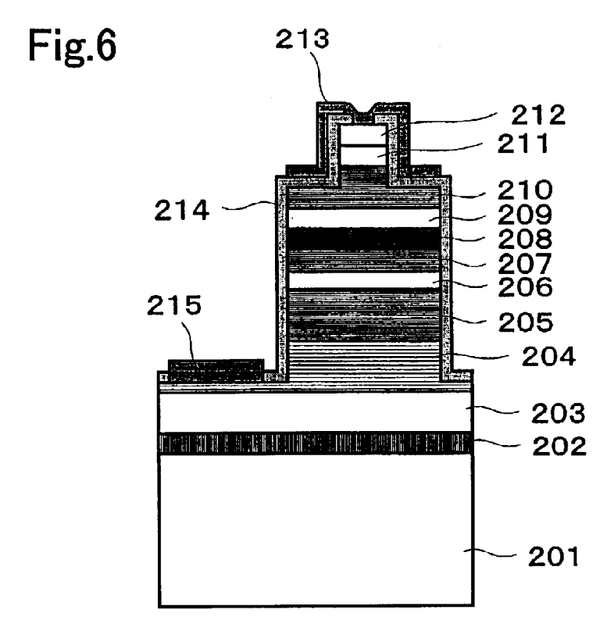
FIG. 6 shows a structural sectional view of a nitride semiconductor laser device fabricated by a method according to one embodiment of the present invention.

FIG. 6 shows a structural sectional view of a nitride semiconductor laser device fabricated by the method of one embodiment of the present invention. In the process for fabricating the semiconductor laser device, the MOVPE technique is employed as the crystal growth method. The carrier gas for supplying the material to the substrate contains at least one inert gas, such as $N_2$, $H_2$, etc. Hereunder, the semiconductor growth process will be explained.

The fabrication of the nitride semiconductor laser device of the present embodiment is conducted using an $Al_{0.07}Ga_{0.93}N$ template by following the procedure of Embodiment 1. First, a C-plane sapphire substrate 201 is heated to 1,150° C. while supplying only a carrier gas of $N_2$ and $H_2$, surface impurities are removed, and the temperature is lowered to 550° C.

Thereafter, trimethylgullium (TMG), trimethylaluminum (TMA), trimethylindium (TMI), and $NH_3$ are supplied at 550° C. for depositing an $Al_{0.1}Ga_{0.89}In_{0.01}N$ low-temperature deposited layer (not shown) on the sapphire substrate 201, and then the temperature is raised to 1,120° C. Subsequently, the low-temperature deposited layer is subjected to heat treatment under an atmosphere of $N_2$, $H_2$, and $NH_3$ for two minutes to convert the layer into an $Al_{0.1}Ga_{0.89}In_{0.01}N$ faceted layer 202. Then the growth of an $Al_{0.07}Ga_{0.93}N$ layer is started by supplying TMG, TMA, and $NH_3$ while maintaining the temperature at 1,120° C.

Initial growth of the $Al_{0.07}Ga_{0.93}N$ layer 203 is conducted until the thickness thereof becomes about 50 nm, then, as growth continues, the temperature is continuously lowered to 1,090° C. Then main growth of the $Al_{0.07}Ga_{0.93}N$ layer 203 is then conducted until the thickness becomes 2 μm. Thereafter, an n-type $Al_{0.13}Ga_{0.87}N/Al_{0.07}Ga_{0.93}N$ superlattice contact layer 204, an n-type $Al_{0.16}Ga_{0.84}N/Al_{0.1}Ga_{0.9}N$ superlattice cladding layer 205, an n-type GaN optical guiding layer 206, a GaInN/GaN multiple quantum well (MQW) active layer 207, a p-type $Al_{0.2}Ga_{0.8}N$ capping layer 208, a p-type GaN optical guiding layer 209, a p-type $Al_{0.16}Ga_{0.84}N/Al_{0.1}Ga_{0.9}N$ superlattice cladding layer 210, a p-type $Al_{0.01}Ga_{0.99}N$ second contact layer 211, and a p-type $Ga_{0.85}In_{0.15}N$ first contact layer 212 are sequentially grown in such a manner that their a-axis lattice constants in the C-plane achieve lattice-matching. When the GaInN/GaN multiple quantum well (MQW) active layer 207 and the p-type $Ga_{0.85}In_{0.15}N$ first contact layer 212 are formed, the temperature is lowered to 780° C. to allow the In component to be incorporated thereinto.

Then, the p-type $Al_{0.16}Ga_{0.84}N/Al_{0.1}Ga_{0.9}N$ superlattice cladding layer 210, the p-type $Al_{0.01}Ga_{0.99}N$ second contact layer 211, and the p-type $Ga_{0.85}In_{0.15}N$ first contact layer 212 are processed into a ridge-stripe form. The width between the stripes is about 2 to 4 μm. Thereafter, etching is conducted until a portion of the n-type $Al_{0.13}Ga_{0.87}N/Al_{0.07}Ga_{0.93}N$ superlattice contact layer 204 becomes exposed.

Consequently, the surface thereof is covered with an $SiO_2$ insulating film, and contact holes are formed on the n-type $Al_{0.13}Ga_{0.87}N/Al_{0.07}Ga_{0.93}N$ superlattice contact layer 204 and the p-type $Ga_{0.85}In_{0.15}N$ first contact layer 212. Then, on the insulating film 214, an n-electrode 215 and a p-electrode 213 are provided so that they are electrically connected to the n-type $Al_{0.13}Ga_{0.87}N/Al_{0.07}Ga_{0.93}N$ superlattice contact layer 204 and the p-type $Ga_{0.85}In_{0.15}N$ first contact layer 212, respectively, through the contact holes. Thereby, a nitride semiconductor laser device is fabricated. The p-type $Ga_{0.85}In_{0.15}N$ first contact layer 212 is characterized in that it has a smaller band gap and greater amount of p-type impurities than the p-type $Al_{0.01}Ga_{0.99}N$ second contact layer 211 in order to reduce the contact resistance between the first contact layer 212 and the p-electrode 213. In this device, when a voltage is applied between the n-electrode 215 and the p-electrode 213, holes from the p-electrode 213 and electrons from the n-electrode 215 are injected into the MQW active layer 207. The resulting gain in the MQW active layer 207 oscillates the laser at the wavelength of 405 nm.

Figure 7:
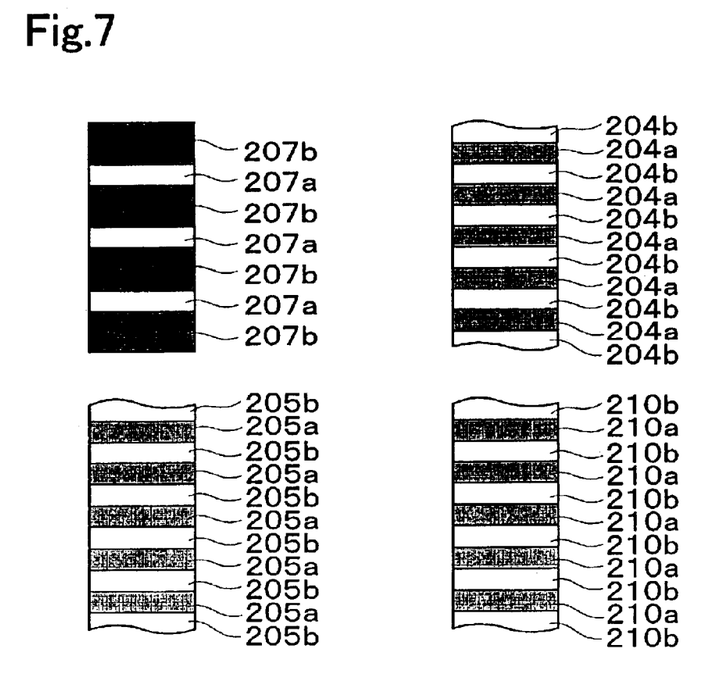
FIG. 7 is a fragmentary sectional view showing the nitride semiconductor laser device.

As shown in FIG. 7, the MQW active layer 207 is composed of a 3-nm-thick $Ga_{0.9}In_{0.1}N$ well layer 207a and a 6-nm-thick GaN barrier layer 207b. The n-type $Al_{0.13}Ga_{0.87}N/Al_{0.07}Ga_{0.93}N$ superlattice contact layer 204 is composed of a 2.5-nm-thick n-type $Al_{0.13}Ga_{0.87}N$ layer 204a and a 2.5-nm-thick $Al_{0.07}Ga_{0.93}N$ layer 204b, and these layers are deposited for 600 cycles (making a total thickness of 3 μm). Si is used as the n-type dopant, and doping is conducted in at least one of the $Al_{0.13}Ga_{0.87}N$ and $Al_{0.07}Ga_{0.93}N$ layers (or both of them). The n-type $Al_{0.16}Ga_{0.84}N/Al_{0.1}Ga_{0.9}N$ superlattice cladding layer 205 is composed of a 2.5-nm-thick n-type $Al_{0.16}Ga_{0.84}N$ layer 205a and a 2.5-nm-thick $Al_{0.1}Ga_{0.9}N$ layer 205b, and these layers are deposited for 200 cycles (making a total thickness of 1 μm). Si is used as the n-type dopant, and doping is conducted in at least one of the $Al_{0.16}Ga_{0.84}N$ and $Al_{0.1}Ga_{0.9}N$ layers (or both of them). The p-type $Al_{0.16}Ga_{0.84}N/Al_{0.1}Ga_{0.9}N$ superlattice cladding layer 210 is composed of a 2.5-nm-thick p-type $Al_{0.16}Ga_{0.84}N$ layer 210a and a 2.5-nm-thick $Al_{0.1}Ga_{0.9}N$ layer 210b, and these layers are deposited for 140 cycles (making a total thickness of 0.7 μm). Mg is used as a p-type dopant, and doping is conducted at least one of the $Al_{0.16}Ga_{0.84}N$ and $Al_{0.1}Ga_{0.9}N$ layers (or both of them).

The lattice constant in the a-axis direction of the thus obtained $Al_{0.07}Ga_{0.93}N$ layer 203 is 0.317902 nm. This substantially matches the bulk lattice constant in the a-axis direction of the n-type $Al_{0.13}Ga_{0.87}N/Al_{0.07}Ga_{0.93}N$ superlattice contact layer 204 (with an average Al ratio of 0.1), the n-type $Al_{0.16}Ga_{0.84}N/Al_{0.1}Ga_{0.9}N$ superlattice cladding layer 205 (with an average Al ratio of 0.13), and the p-type $Al_{0.16}Ga_{0.84}N/Al_{0.1}Ga_{0.9}N$ superlattice cladding layer 210 (with an average Al ratio of 0.13), which tend to suffer from cracks when fabricating a laser structure. By further subjecting the $Al_{0.1}Ga_{0.89}In_{0.01}N$ low-temperature deposited layer to heat treatment under the previously described optimum conditions, it is possible to obtain a high-quality and low-resistance $Al_{0.07}Ga_{0.93}N$ layer 203 with suppressed crystal defects.

As a result, it was confirmed that, on the front surface of the substrate, it becomes possible to grow a flat laser structure crystal that is free from cracks. The threshold current density of the resulting laser oscillation is also achieved with a lower electric current than in conventional types, while also attaining a significant increase in yield.

Furthermore, by using the n-type $Al_{0.13}Ga_{0.87}N/Al_{0.07}Ga_{0.93}N$ superlattice contact layer 204, the electron mobility of this device is increased because the electron conduction parallel to the C-plane in the contact layer becomes two-dimensional. Therefore, when electrons and holes are injected, they can be uniformly injected into the MQW active layer 207 without in-plane distribution.

Moreover, the n-type layer is a 4-μm-thick layer that comprises the n-type $Al_{0.13}Ga_{0.87}N/Al_{0.07}Ga_{0.93}N$ superlattice contact layer 204 and the n-type $Al_{0.16}Ga_{0.84}N/Al_{0.1}Ga_{0.9}N$ superlattice cladding layer 205. This suppresses light leakage by providing a thicker layer having a lower refractive index on the substrate side than the conventional types, in which an AlGaN layer is used only in the cladding layer. As a result, instability in the vertical transverse mode attributable to light leakage (multimode laser oscillation in the vertical transverse mode) can be reduced and single-transverse-mode laser oscillation can be achieved.

In the present embodiment, the contact layer and the cladding layer formed on the sapphire substrate are formed of AlGaN; however, the contact layer and the cladding layer are not limited to AlGaN as long as their lattice constants can be substantially matched to that of an $Al_wGa_{1-w}N$ template that comprises an $Al_wGa_{1-w}N$ ($0 \leq w \leq 0.3$) layer formed on a faceted layer. Therefore, they can be AlGaInN, BAlGaN, BAlInN, BAlGaInN, etc.

In the present embodiment, formation of the AlGaInN low-temperature deposited layer on the sapphire substrate and its heat treatment, fabrication of the AlGaN template, and fabrication of the laser structure are conducted in a continuous procedure. However, it is also possible to fabricate a laser structure by forming the AlGaN template, then temporarily removing the AlGaN template and processing it by forming an insulating film mask onto it, dry etching it, etc., and then employing ELO (Epitaxial Lateral Overgrowth) technique to fabricate an AlGaN template with low dislocation density. In this case, the use of ELO on the AlGaN may form growth nuclei on the insulating film mask that are undesirable for lowering the dislocation density, so a type of ELO with an airbridge structure is preferable.

While a C-plane sapphire substrate is used in the present embodiment, it is also possible to use an A-plane sapphire substrate, or a substrate that is slightly inclined relative to the C-plane toward the A-plane, M-plane, etc. Other than the sapphire substrate, it is also possible to use a substrate composed of gallium arsenide, spinel, magnesium oxide, gallium nitride, aluminum gallium nitride, etc. It is preferable that the material have a coefficient of thermal expansion greater than that of the GaN based semiconductor layer that serves as a template.

(Embodiment 3)

Figure 8:
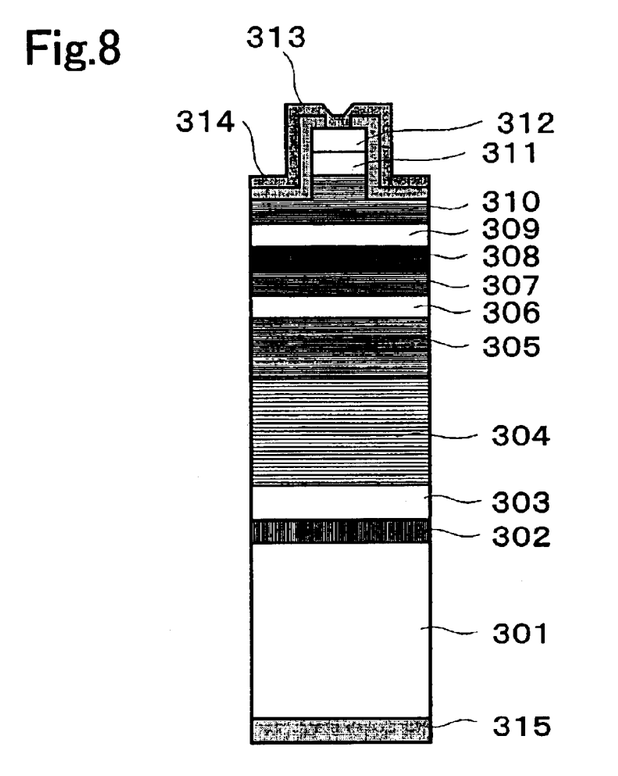
FIG. 8 is a diagram showing the cross sectional structure of a nitride semiconductor laser device fabricated by a method according to another embodiment of the present invention.

This embodiment is an example in which, instead of the sapphire substrate used in Embodiment 2, a GaN substrate 301 that has n-type conductivity (a substrate doped with an n-type impurity, such as Si, Ge, O, etc.) is used. In this embodiment, a nitride semiconductor laser device having a cross-sectional structure as shown in FIG. 8 is fabricated.

An n-type $Al_{0.1}Ga_{0.89}In_{0.01}N$ low-temperature deposited layer (not shown) is formed by doping Si on an n-type GaN substrate 301 and subjecting the low-temperature deposited layer to heat treatment. The layer is converted into an $Al_{0.1}Ga_{0.89}In_{0.01}N$ faceted layer 302, an n-type $Al_{0.07}Ga_{0.93}N$ layer 303 is grown, and a nitride semiconductor laser device is fabricated by following the procedure of Embodiment 2. An n-electrode 315 is arranged on the back surface of the n-type GaN substrate 301, and the laser is oscillated by applying current directly between the n-electrode 315 and a p-electrode 314 that is disposed on the front surface of the substrate. A fabricating process for a nitride semiconductor laser device will be explained next.

An $Al_{0.07}Ga_{0.93}N$ template that is formed according to the method described in Embodiment 1 is used to fabricate the nitride semiconductor laser device of the present embodiment. First, in order to prevent deterioration of the substrate during the crystal growth, an AlN film having a thickness of 0.1 µm is deposited onto the back side of the C-plane n-type GaN substrate 301 as a protective film. In the formation of the AlN, an ECR (Electron Cyclotron Resonance) sputtering machine is used. The material of the protective film is not limited as long as it has a heat resistance strong enough to resist the growth temperature of each layer during the formation of the laser structure, such as alumina, $SiO_2$, SiNx, etc. If the protective film becomes unnecessarily thick, warping or cracks may occur due to a difference in the coefficient of thermal expansion between the substrate and the protective film during crystal growth, or uneven heating of the substrate may occur due to a difference in thermal conductivity between the two, and therefore it is preferable that the thickness of the protective film be as thin as possible within the range in which the substrate can be protected.

After forming the protective film on the back side of the substrate, an $Al_{0.07}Ga_{0.93}N$ template is formed by following the procedure of Embodiment 1. The temperature is raised to 900° C. while supplying only a carrier gas of $N_2$ and $H_2$, after removing the surface impurities on the n-type GaN substrate 301, the temperature is lowered to 550° C. Then, TMG, TMA, TMI, and dopant such as Si and $NH_3$ are supplied at 550° C. for forming an $Al_{0.1}Ga_{0.89}In_{0.01}N$ low-temperature deposited layer (not shown) on the n-type GaN substrate 301. Thereafter, the temperature is raised to 1,120° C., the layer is subjected to heat treatment under the atmosphere of $N_2$, $H_2$, or $NH_3$ for two minutes and converted into an $Al_{0.1}Ga_{0.89}In_{0.01}N$ faceted layer 302. Then, TMG, TMA, $NH_3$, and Si, which serves as dopant, are supplied at 1,120° C. for starting the growth of the n-type $Al_{0.07}Ga_{0.93}N$ layer 303. Initial growth of the n-type $Al_{0.07}Ga_{0.93}N$ layer 303 is conducted until the thickness thereof becomes about 50 nm, then, as growth continues, the temperature is continuously lowered to 1,090° C. Consequently, main growth of the n-type $Al_{0.07}Ga_{0.93}N$ layer 303 is conducted until the thickness reaches 2 µm. Thereafter, a nitride semiconductor laser device is fabricated by following the procedure of Embodiment 2.

After fabricating the nitride semiconductor laser, the protective film formed on the back surface of the n-type GaN substrate 301 is removed by mechanical lapping, dry etching, wet etching, etc. Then, the p-type $Al_{0.16}Ga_{0.84}N$/$Al_{0.1}Ga_{0.9}N$ superlattice cladding layer 310, the p-type $Al_{0.01}Ga_{0.99}N$ second contact layer 311, and the p-type $Ga_{0.85}In_{0.15}N$ first contact layer 312 are processed into a ridge-stripe form, and both sides of the ridge are covered with an $SiO_2$ insulating film 314 to form an electric current input region. The width between the stripes is about 2 to 4 µm. Then, a p-electrode 313 is formed on the surface of the insulating film 314 so as to conduct electricity to a p-type $Ga_{0.85}In_{0.15}N$ first contact layer 312 that is disposed on the opening of the insulating film 314. On the back surface of the n-type GaN substrate 301, an n-electrode 315 is formed. Thereby, a nitride semiconductor laser device is fabricated. In this device, when a voltage is applied between the n-electrode 315 and the p-electrode 313, holes from the p-electrode 313 and electrons from the n-electrode 215 are injected into the MQW active layer 307. The resulting gain in the MQW active layer 307 oscillates the laser at the wavelength of 405 nm. In this device, the n-electrode 315 and the p-electrode 313 are formed so as to be aligned in the longitudinal direction, and therefore an even injection into the MQW active layer 307 can be achieved without in-plane distribution.

Furthermore, the n-type layer is composed of a layer having the total thickness of 6 µm comprising the n-type $Al_{0.07}Ga_{0.93}N$ layer 303, the n-type $Al_{0.13}Ga_{0.87}N$/$Al_{0.07}Ga_{0.93}N$ superlattice layer 304, and the n-type $Al_{0.16}Ga_{0.84}N$/$Al_{0.1}Ga_{0.9}N$ superlattice cladding layer 305. This suppresses light leakage by providing a thicker layer having a lower refractive index on the substrate side than the conventional types, in which an AlGaN layer is used only in the cladding layer. As a result, instability in the vertical transverse mode attributable to light leakage (multimode laser oscillation in the vertical transverse mode) can be reduced and single-transverse-mode laser oscillation can be achieved.

The lattice constant in the a-axis direction of the thus obtained $Al_{0.07}Ga_{0.93}N$ layer 303 is 0.317934 nm. This substantially matches the bulk lattice constant in the a-axis direction of the n-type $Al_{0.13}Ga_{0.87}N$/$Al_{0.07}Ga_{0.93}N$ superlattice contact layer 304, the n-type $Al_{0.16}Ga_{0.84}N$/$Al_{0.1}Ga_{0.9}N$ superlattice cladding layer 305, and the p-type $Al_{0.16}Ga_{0.84}N$/$Al_{0.1}Ga_{0.9}N$ superlattice cladding layer 310, which tend to suffer form cracks when fabricating a laser structure. As a result, it was confirmed that, on the front surface of the substrate, it becomes possible to grow a flat laser structure crystal that is free from cracks. The threshold current density of the resulting laser oscillation is also achieved with a lower electric current than in conventional types, while also attaining a significant increase in yield.

In the present embodiment, the contact layer and the cladding layer formed on the sapphire substrate are made of AlGaN; however, the contact layer and the cladding layer are not limited to AlGaN as long as their lattice constants can be substantially matched to that of an $Al_wGa_{1-w}N$ template that comprises an $Al_wGa_{1-w}N$ ($0 \leq w \leq 0.3$) layer formed on the faceted layer, and they can be AlGaInN, BAlGaN, BAlInN, BAlGaInN, etc.

While a C-plane n-type GaN substrate is used in the present embodiment, it is also possible to use an A-plane n-type GaN substrate, or a substrate that is slightly inclined relative to the C-plane toward the A-plane, M-plane, etc. Other than the GaN substrate, it is also possible to use a substrate composed of gallium arsenide, spinel, magnesium oxide, gallium nitride, aluminum gallium nitride, etc. It is preferable that the material have a coefficient of thermal expansion greater than that of the GaN based semiconductor layer that serves as a template.

(Embodiment 4)

Figure 9:
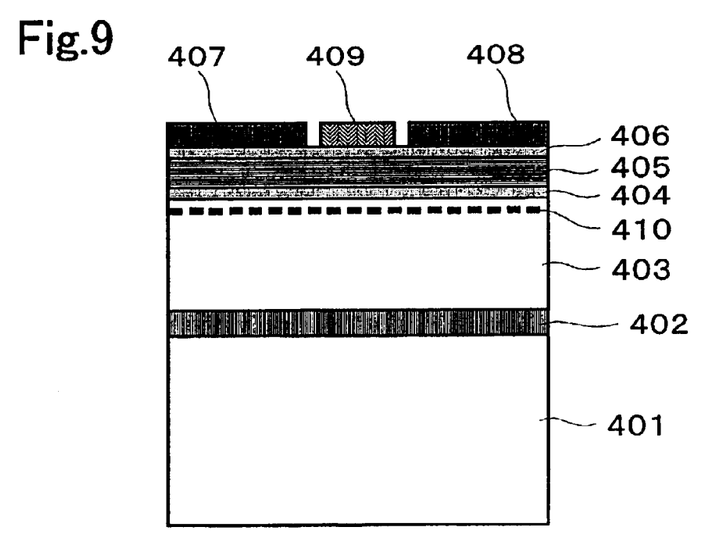
FIG. 9 is a diagram showing the cross sectional structure of a modulation-doped AlGaN/GaN heterostructure field-effect transistor device fabricated by a method according to one embodiment of the present invention.

FIG. 9 is a diagram showing the cross sectional structure of a modulation-doped AlGaN/GaN heterostructure field-effect transistor device fabricated by the method of one embodiment of the present invention. In the present embodiment, the MOVPE method is employed for crystal growth, and the carrier gas for supplying the materials to the substrate contains at least an inert gas, such as nitrogen, hydrogen, or the like. Hereunder the growth process will be explained.

Fabrication of a nitride semiconductor heterostructure field-effect transistor device of the present embodiment is conducted by forming an $Al_{0.07}Ga_{0.93}N$ template by following the procedure of Embodiment 1. First, a C-plane sapphire substrate 401 is heated to 1,150° C. while supplying only a carrier gas of $N_2$ and $H_2$, and then, after removing the surface impurities, the temperature is lowered to 550° C. Thereafter, TMG, TMA, TMI, and $NH_3$ are supplied at 550° C. for depositing an $Al_{0.3}Ga_{0.69}In_{0.01}N$ low-temperature deposited layer (not shown) on the sapphire substrate 401, and then the temperature is raised to 1,120° C. Subsequently, the low-temperature deposited layer is subjected to heat treatment under the atmosphere of $N_2$, $H_2$, and $NH_3$ for two minutes and converted into an $Al_{0.3}Ga_{0.69}In_{0.01}N$ faceted layer 402. Then the growth of a GaN layer 403 is started by supplying TMG, TMA, and $NH_3$ at 1,120° C. Initial growth of the GaN layer 403 is conducted until the thickness thereof becomes about 30 nm, then, as growth continues, the temperature is lowered in 10° C. steps to 1,070° C., and then main growth of the GaN layer 403 is conducted until the thickness thereof becomes 4 µm.

Then, on the GaN layer 403, an undoped $Al_{0.3}Ga_{0.7}N$ spacer layer 404, an n-type $Al_{0.3}Ga_{0.7}N$ barrier layer 405 having Si doped therein as an impurity, and an undoped $Al_{0.3}Ga_{0.7}N$ capping layer 406 are subjected to crystal growth in this order in such a manner that their lattice constants in the a-axis direction in the C-plane match each other to achieve lattice-matching. Here, achieving lattice-matching in the a-axis direction means that, relative to the GaN layer 403, the $Al_{0.3}Ga_{0.7}N$ spacer layer 404, the $Al_{0.3}Ga_{0.7}N$ barrier layer 405, and $Al_{0.3}Ga_{0.7}N$ capping layer 406 have the same lattice constants in the a-axis direction by elastic deformation, and no defects or cracks occur on the hetero interface.

After forming a mesa structure that has a gate width of 50 µm, on the undoped $Al_{0.3}Ga_{0.7}N$ capping layer 406, a source electrode 407, a drain electrode 408, and a gate electrode 409 are formed. When a modulation-doped AlGaN/GaN heterostructure field-effect transistor device is fabricated in this manner, a two-dimensional electron gas 410 is formed around the hetero interface between the GaN layer 403 and the $Al_{0.3}Ga_{0.7}N$ spacer layer 404.

In this device, the density of the two-dimensional electron gas was about $8 \times 10^{12}$ cm$^{-2}$ and the electron mobility thereof was 1,200 cm$^2$/Vs at room temperature. By applying an electric field between the source electrode 407 and drain-electrode 408 while applying a voltage to the gate electrode 409, it is possible to obtain a transistor characteristic having a transconductance of about 300 mS/mm at a gate voltage of 2 V with a high degree of reproducibility.

In the present embodiment, by forming the $Al_{0.3}Ga_{0.69}In_{0.01}N$ low-temperature deposited layer on the sapphire substrate 401 and controlling the growth temperature for the initial growth of GaN, the lattice constant of the GaN layer 403 was controlled, and therefore the two-dimensional electron gas could be formed in a controlled manner. This made it possible to obtain a modulation-doped AlGaN/GaN heterostructure field-effect transistor with high yield.

On the other hand, when the growth temperature of the initial growth of GaN was not controlled in order to grow the GaN layer 403, the a-axis lattice constants of the GaN layer 403 differed in each crystal in the range of 0.31871 nm to 0.31822 nm, and the density of the two-dimensional electron gas at room temperature varied in the range of $5 \times 10^{12}$ cm$^{-2}$ to $1 \times 10^{13}$ cm$^{-2}$. Therefore, a transistor could not be obtained with a high degree of reproducibility. This is because, even if the Al ratio of the n-type $Al_{0.3}Ga_{0.7}N$ barrier layer 405 and the doping density are strictly controlled, the two-dimensional electron gas density induced by the piezo-electric field varies due to variations in the lattice constants of the GaN layer 403.

In the present embodiment, the GaN layer 403 is grown on the sapphire substrate 401 through the $Al_{0.3}Ga_{0.69}In_{0.01}N$ faceted layer 402. However, the leakage current of a transistor device decreases when the Al ratio of the faceted layer increases. The electron mobility increases when the Al ratio decreases. This is because when the Al ratio of the faceted layer increases, the threading dislocation density increases and the electron mobility decreases. Actually, when the Al ratio of the faceted layer is 30%, the leakage current reached the minimum and the electron mobility reached the maximum.

While a C-plane sapphire substrate is used in the present embodiment, it is also possible to use an A-plane sapphire substrate, or a substrate that is slightly inclined relative to the C-plane toward the A-plane, M-plane, etc. Other than the sapphire substrate, it is also possible to use a substrate composed of gallium arsenide, spinel, magnesium oxide, gallium nitride, aluminum gallium nitride, etc. It is preferable that the material have a coefficient of thermal expansion greater than that of the GaN or AlGaN template.

It is possible to use AlGaInN, BN, and all types of their mixed crystal nitride based semiconductors in the spacer layer, the barrier layer, and the capping layer as long as their lattice constants are made to match that of the $Al_wGa_{1-w}N$ template by forming them under the same conditions in which the GaN layer is formed during the process of forming the $Al_wGa_{1-w}N$ ($0 \leq w \leq 0.3$) template.

In the present embodiment, film-formation of the AlGaInN low-temperature deposited layer on the sapphire substrate and its heat treatment, formation of the AlGaN template, fabrication of the heterostructure field-effect transistor are conducted in a continuous procedure. However, it is also possible to fabricate a transistor structure by forming the AlGaN template, then temporarily removing the AlGaN template and processing it by forming an insulating film mask onto it, dry etching it, etc., and then employing ELO (Epitaxial Lateral Overgrowth) technique to fabricate an AlGaN template with low dislocation density. In this case, the use of ELO on the AlGaN may form growth nuclei on the insulating film mask that are undesirable for lowering the dislocation density, so a type of ELO with an airbridge structure is preferable.

INDUSTRIAL APPLICABILITY

As described above, employing the present invention makes it possible to provide a nitride semiconductor device with high quality and high reliability.

What is claimed is:

1. A method for fabricating a nitride semiconductor device comprising the steps of:

forming a low-temperature deposited layer composed of a Group III-Group V nitride semiconductor that contains at least Al onto a surface of a substrate at a first temperature;

subjecting the low-temperature deposited layer to heat treatment at a second temperature, which is higher than the first temperature, and converting the low-temperature deposited layer into a faceted layer;

initially growing a GaN based semiconductor layer onto a surface of the faceted layer at a third temperature; and fully growing the GaN based semiconductor layer at a fourth temperature, which is lower than the third temperature.

2. The method for fabricating a nitride semiconductor device according to claim 1, wherein the low-temperature deposited layer is expressed as $Al_xGa_yIn_{1-x-y}N$ ($0<x\leq0.3$, $0<y<1$, $0<x+y\leq1$).

3. The method for fabricating a nitride semiconductor device according to claim 1, wherein the second temperature is higher than a temperature at which a rearrangement of atoms occurs in the low-temperature deposited layer and lower than a temperature at which decomposition and desorption occur in the low-temperature deposited layer.

4. The method for fabricating a nitride semiconductor device according to claim 1, wherein the second temperature is in the range of 800 to 1,150° C.

5. The method for fabricating a nitride semiconductor device according to claim 1, wherein the third temperature is determined by a relationship between the initial growth temperature of the GaN based semiconductor layer and a lattice constant in an axial direction along the surface of the substrate in the GaN based semiconductor layer.

6. The method for fabricating a nitride semiconductor device according to claim 1, wherein the third temperature is in the range of 850 to 1,150° C.

7. The method for fabricating a nitride semiconductor device according to claim 1, wherein a variance between the third temperature and the fourth temperature is in the range of 10 to 50° C.

8. The method for fabricating a nitride semiconductor device according to claim 1, wherein the second temperature and the third temperature are the same.

9. The method for fabricating a nitride semiconductor device according to claim 1, which further comprises a step of fabricating a nitride semiconductor light emitting device by subjecting an n-type nitride semiconductor layer, an active layer, and a p-type nitride semiconductor layer to crystal growth on the GaN based semiconductor layer in this order in such a manner that their lattice constants match that of the GaN based semiconductor layer.

10. The method for fabricating a nitride semiconductor device according to claim 9, wherein the substrate, the low-temperature deposited layer, and the GaN based semiconductor layer are n-type.

11. The method for fabricating a nitride semiconductor device according to claim 1, which further comprises a step of fabricating a modulation-doped heterostructure field-effect transistor by subjecting a spacer layer, an n-type barrier layer, and a capping layer to crystal growth on the surface of the GaN based semiconductor layer in this order in such a manner that their lattice constant match that of the GaN based semiconductor layer to form a hetero interface between the GaN based semiconductor layer and the spacer layer.

* * * * *